US010326002B1

(12) United States Patent
Zang et al.

(10) Patent No.: US 10,326,002 B1
(45) Date of Patent: Jun. 18, 2019

(54) SELF-ALIGNED GATE CONTACT AND CROSS-COUPLING CONTACT FORMATION

(71) Applicant: GLOBALFOUNDRIES Inc., Grand Cayman (KY)

(72) Inventors: Hui Zang, Guilderland, NY (US); Ruilong Xie, Niskayuna, NY (US); Scott Beasor, Greenwich, NY (US); Zhenyu Hu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/004,935

(22) Filed: Jun. 11, 2018

(51) Int. Cl.
*H01L 29/02* (2006.01)
*H01L 29/778* (2006.01)
*H01L 29/66* (2006.01)
*H01L 21/768* (2006.01)
*H01L 21/8234* (2006.01)
*H01L 21/311* (2006.01)
*H01L 29/417* (2006.01)

(52) U.S. Cl.
CPC ........ *H01L 29/6656* (2013.01); *H01L 21/311* (2013.01); *H01L 21/76897* (2013.01); *H01L 21/823468* (2013.01); *H01L 21/823475* (2013.01); *H01L 29/41783* (2013.01); *H01L 29/66515* (2013.01)

(58) Field of Classification Search
CPC ......... H01L 29/66893–66924; H01L 29/8086; H01L 2924/13062; H01L 27/098; H01L 27/14679; H01L 29/04–045; H01L 29/16–2206
See application file for complete search history.

(56) References Cited

U.S. PATENT DOCUMENTS

| 7,626,489 | B2 | 12/2009 | Berkman et al. | |
|---|---|---|---|---|
| 9,337,099 | B1 | 5/2016 | Jain et al. | |
| 9,825,031 | B1 | 11/2017 | Bouche et al. | |
| 2005/0051796 | A1* | 3/2005 | Parikh | H01L 29/402 257/192 |
| 2006/0071776 | A1 | 4/2006 | White et al. | |
| 2007/0147160 | A1 | 6/2007 | Hanzawa et al. | |
| 2015/0287604 | A1 | 10/2015 | Stephens et al. | |
| 2016/0379925 | A1* | 12/2016 | Ok | H01L 21/76895 257/288 |

* cited by examiner

*Primary Examiner* — Matthew L Reames
*Assistant Examiner* — Wilner Jean Baptiste
(74) *Attorney, Agent, or Firm* — Thompson Hine LLP; Francois Pagette

(57) ABSTRACT

Methods of forming self-aligned gate contacts and cross-coupling contacts for field-effect transistors and structures for field effect-transistors that include self-aligned gate contacts and cross-coupling contacts. A sidewall spacer is formed at a sidewall of a gate structure and an epitaxial semiconductor layer is formed adjacent to the sidewall spacer. After forming the epitaxial semiconductor layer, the sidewall spacer is recessed with a first etching process. After recessing the spacer, the gate structure is recessed with a second etching process. After recessing the gate structure, a cross-coupling contact is formed that connects the gate structure with the epitaxial semiconductor layer.

11 Claims, 12 Drawing Sheets

SELF-ALIGNED GATE CONTACT AND CROSS-COUPLING CONTACT FORMATION

BACKGROUND

The present invention relates to semiconductor device fabrication and integrated circuits and, more specifically, to methods of forming self-aligned gate contacts and cross-coupling contacts for field-effect transistors and structures for field effect-transistors that include self-aligned gate contacts and cross-coupling contacts.

Contacts may provide vertical electrical connections to features of semiconductor devices, such as the gate structures of a field-effect transistor. Self-aligned contacts are formed in contact openings that are constrained during etching by the configuration of adjacent structures, e.g., sidewall spacers on adjacent gate structures, as opposed to being constrained by a patterned resist. Gate caps are provided over the gate structures to protect the metal gate during the etching of the contact openings for the self-aligned contacts.

Self-aligned contacts connected with a metal gate of a field-effect transistor may be categorized into distinct types. One type of self-aligned contact, which is only connected with the metal gate, is electrically isolated from nearby features, such as the semiconductor material forming source and drain regions of the field-effect transistor. Another type of self-aligned contact cross-couples the metal gate with the semiconductor material forming the source or drain regions of the field-effect transistor, and may be found, for example, to provide cross-coupling of inverters in a static random access memory bitcell. When forming a self-aligned cross-coupling contact, the top surface of the metal gate is opened by at least partial removal of the gate cap.

A self-aligned contact providing cross-coupling may be weak if the constituent conductor over the metal gate is overly thin. Such over thinning may occur when polishing to planarize the conductor that is deposited to form the self-aligned cross-coupling contact. In addition, the semiconductor material forming the source or drain region is exposed to the etching process that at least partially removes the gate cap to open the top surface of the metal gate, which can damage the semiconductor material.

Improved methods of forming self-aligned gate contacts and cross-coupling contacts for field-effect transistors and structures for field effect-transistors that include self-aligned gate contacts and cross-coupling contacts are needed.

SUMMARY

In an embodiment of the invention, a method includes forming a gate structure, forming a sidewall spacer at a sidewall of the gate structure and forming an epitaxial semiconductor layer adjacent to the sidewall spacer. After forming the epitaxial semiconductor layer, the sidewall spacer is recessed with a first etching process. After recessing the spacer, the gate structure is recessed with a second etching process. After recessing the gate structure, a cross-coupling contact is formed that connects the gate structure with the epitaxial semiconductor layer.

In an embodiment of the invention, a structure includes a gate structure, an epitaxial semiconductor layer, a first sidewall spacer arranged between the gate structure and the epitaxial semiconductor layer, a second sidewall spacer separated from the first sidewall spacer by the gate structure, and a cross-coupling contact extending over the first sidewall spacer to connect the gate structure with the epitaxial semiconductor layer. The first sidewall spacer has a first height, and the second sidewall spacer has a second height that is greater than the first height.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
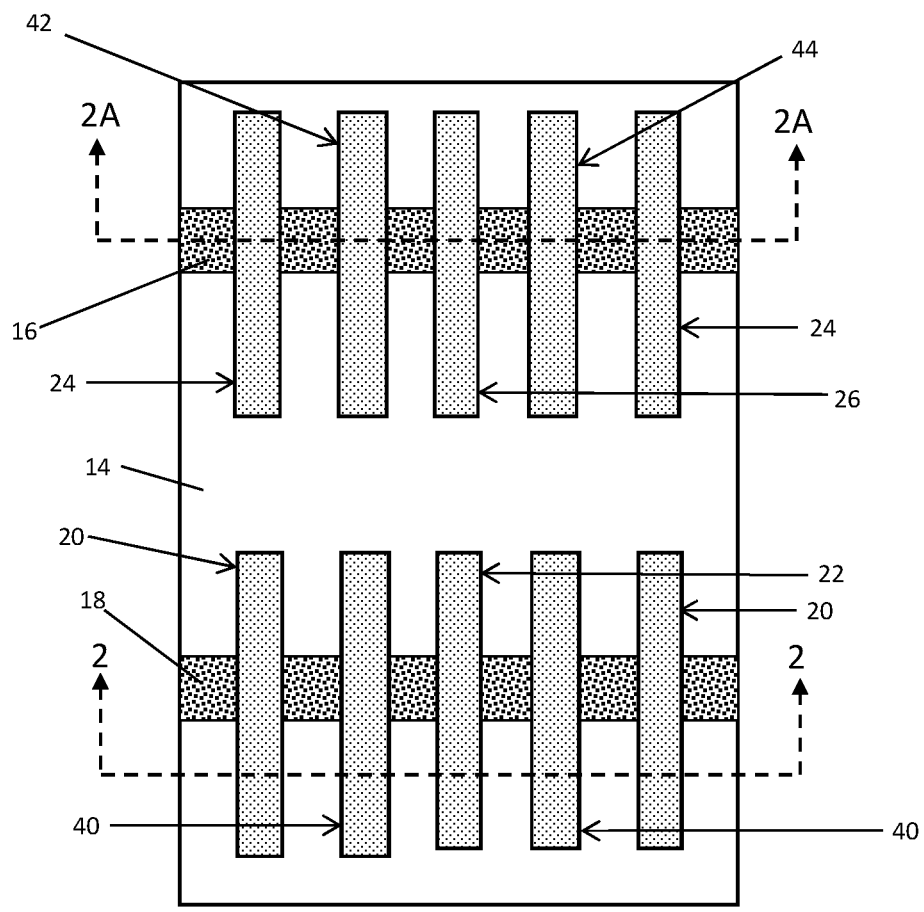
FIG. 1 is a top view of a circuit structure at an initial fabrication stage of a processing method in accordance with embodiments of the invention and in which only the fins, gate structures, epitaxial layers, and substrate are shown for clarity of illustration.
Figure 2:
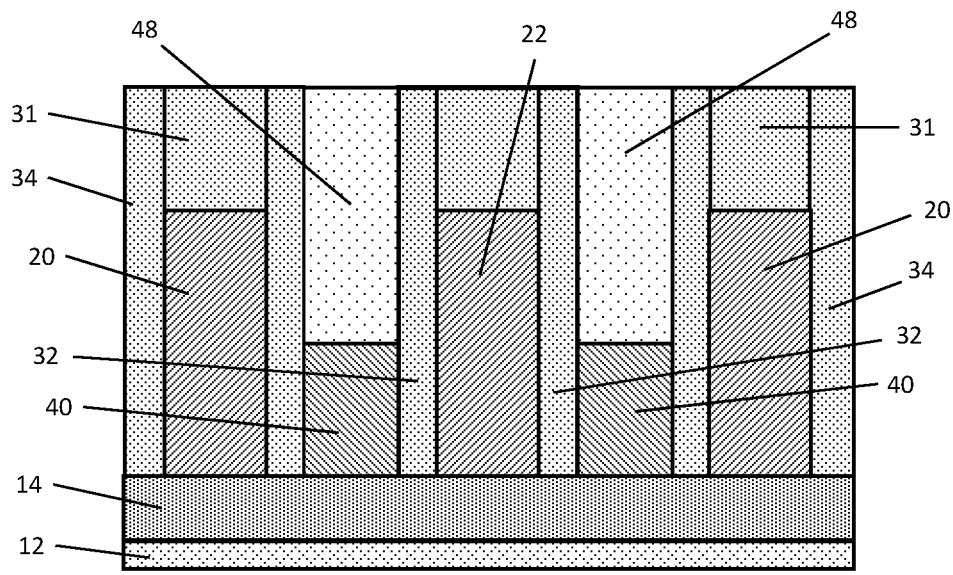
FIG. 2 is a cross-sectional view taken generally along line 2-2 in FIG. 1.
Figure 2A:
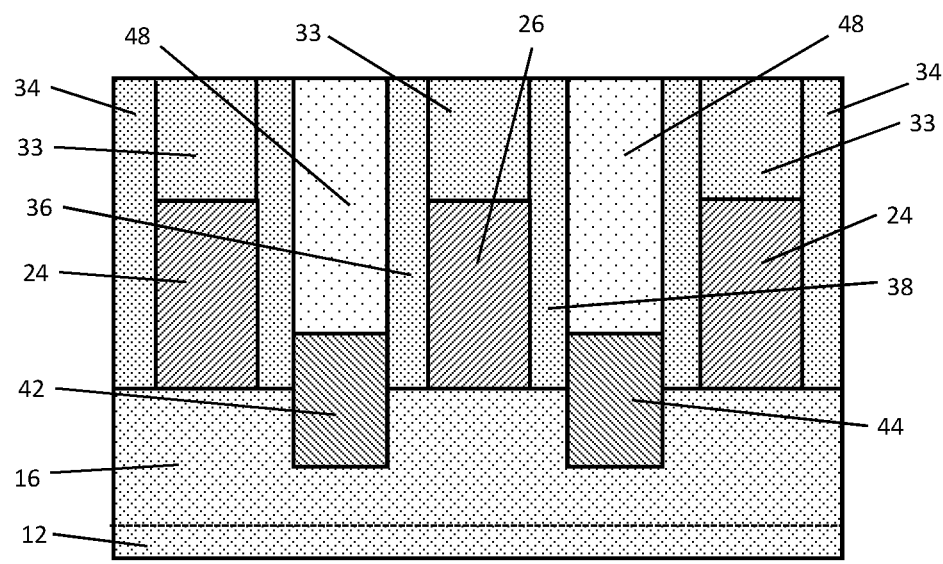
FIG. 2A is a cross-sectional view taken generally along line 2A-2A in FIG. 1.

With reference to FIGS. 1, 2, 2A and in accordance with embodiments of the invention, fins 16, 18 of an integrated circuit structure are formed that project from a substrate 12. The fins 16, 18 may be formed from a semiconductor material, such as an epitaxial layer of semiconductor material grown on the substrate 12 and then patterned. The fins 16, 18 may be patterned by lithography and etching, and cut into given lengths in the layout associated with the specific device structures being formed and their arrangement.

Trench isolation regions 14 are formed that operate to electrically isolate the fins 16, 18 from each other. The trench isolation regions 14 may be formed by depositing a layer composed of a dielectric material, such as an oxide of silicon (e.g., silicon dioxide ($SiO_2$)), by chemical vapor deposition (CVD), and recessing with an etching process.

Gate structures 20, 22, 24, 26 of the integrated circuit structure are formed over the substrate 12 and trench isolation regions 14. Gate structures 20, 22 are formed in one region of the integrated circuit structure and overlap with fin 18, and gate structures 24, 26 are formed in another region of the integrated circuit structure and overlap with fin 16. The gate structures 20, 22, 24 and 26 may each include a metal gate electrode and a high-k gate dielectric layer. The gate dielectric layer of the gate structures 20, 22, 24 and 26 may be composed of a dielectric material, such as a high-k dielectric material like hafnium oxide ($HfO_2$). The metal gate electrode of the gate structures 20, 22, 24 and 26 includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). The metal gate electrode of the gate structures 20, 22, 24 and 26 may include different combinations of the conformal barrier metal layers and/or work function metal layers. For example, the metal gate electrode may include conformal work function metal layers characteristic of a p-type field-effect transistor. As another example, the metal gate electrode may include conformal work function metal layers characteristic of an n-type field-effect transistor.

Self-aligned contact caps 31 are arranged over the gate structures 20, 22, and self-aligned contact cap 33 over the gate structures 24, 26. Sidewall spacers 32 are arranged on sidewalls of the gate structure 20, sidewall spacers 34 are arranged on the sidewalls of the gate structure 22 and gate structure 24, and sidewall spacers 36, 38 are arranged on the sidewalls of the gate structure 26. The sidewall spacers 32, 34, 36, 38 and self-aligned contact caps 31, 33 may be may be composed of a dielectric material, such as silicon nitride.

Epitaxial semiconductor layers 40 are formed between adjacent gate structures 20, 22 and extend in a direction parallel to gate structures 20, 22 as constrained by the spacer-clad gate structures 20, 22 during growth. Epitaxial semiconductor layers 42, 44 are formed between adjacent gate structures 24, 26 and extend in a direction parallel to the gate structures 24, 26 as constrained by the spacer-clad gate structures 24, 26 during growth. The epitaxial semiconductor layers 40, 42, 44 may be formed by an epitaxial growth process in which a semiconductor material, such as silicon or silicon-germanium, nucleates for epitaxial growth from a semiconductor surface, such as the exposed surfaces of fins 16, 18, and grows in crystalline fashion as additional semiconductor material is deposited. The epitaxial semiconductor layers 40, 42, 44 may be doped during epitaxial growth with a p-type dopant (e.g., boron (B), aluminum (Al), gallium (Ga), and/or indium (In)) that provides p-type electrical conductivity or an n-type dopant (e.g., phosphorus (P) and/or arsenic (As)) that provides n-type electrical conductivity. The epitaxial semiconductor layers 40, 42, 44 furnish source/drain regions for field-effect transistors. As used herein, the term "source/drain region" means a doped region of semiconductor material that can function as either a source or a drain of a nanosheet field-effect transistor.

An interlayer dielectric layer 48 is deposited over the epitaxial semiconductor layers 40, 42, 44 following formation of the epitaxial semiconductor layers 40, 42, 44 and fills the space over the epitaxial semiconductor layers 40, 42, 44. The interlayer dielectric layer 48 may be composed of a dielectric material, such as silicon dioxide, that is different from the dielectric material of the self-aligned contact caps 30 and the sidewall spacers 32, 34, 36, 38.

Figure 3:
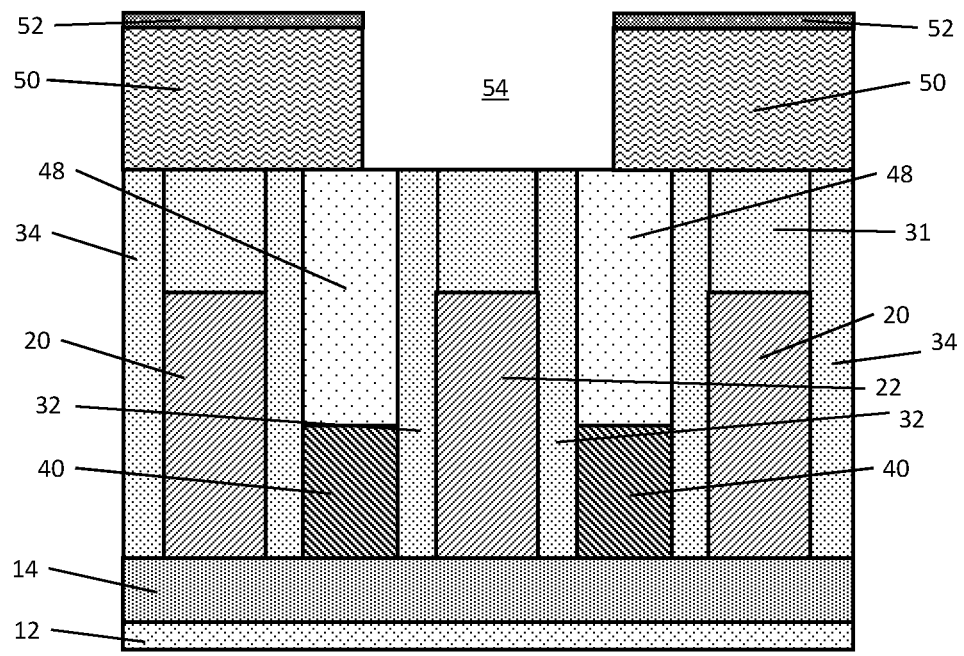
FIGS. 3-12 and 3A-12A are cross-sectional views of the integrated circuit structure at successive fabrication stages of the processing method respectively subsequent to FIGS. 2 and 2A.
Figure 3A:
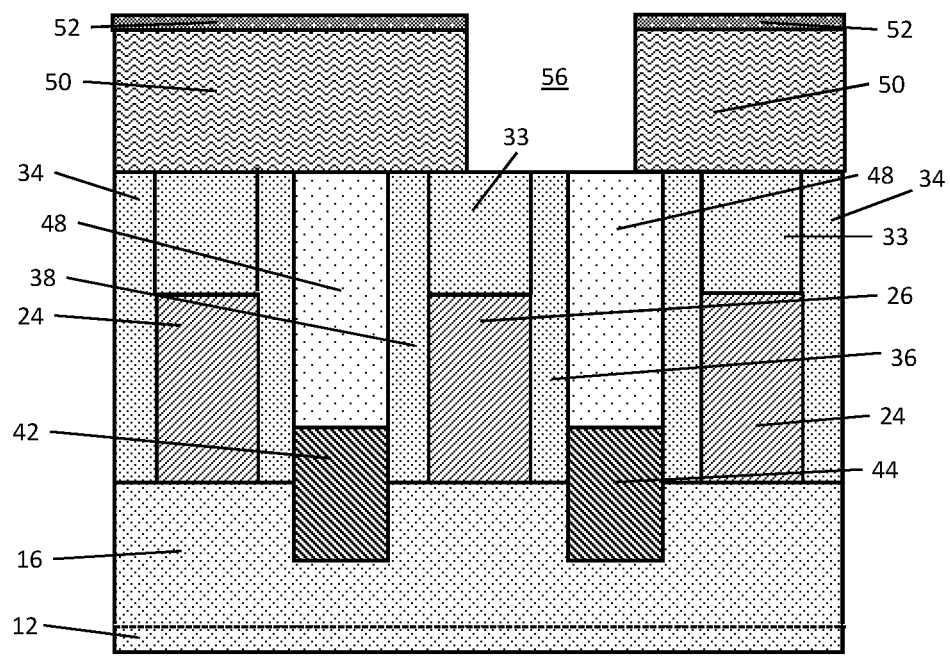

With reference to FIGS. 3 and 3A in which like reference numerals refer to like features in FIGS. 2 and 2A and at a subsequent fabrication stage of the processing method, a patterned lithography stack is applied that includes, for example, a masking layer 50 and a hardmask layer 52. The masking layer 50 may be composed, for example, of an organic planarization layer (OPL) material and/or a resist material, and the hardmask layer 52 may be an anti-reflection coating (ARC) composed of TiOx, Si ARC, SiON, etc. The masking layer 50 and hardmask layer 52 are patterned with lithography and etching to provide an opening 54 that exposes a portion of the self-aligned contact cap 31 over the gate structure 22, as well as the sidewall spacers 32 and portions of the interlayer dielectric layer 48 adjacent to the gate structure 22. Similarly, the masking layer 50 and hardmask layer 52 are patterned with an opening 56 that exposes an upper portion of the self-aligned contact cap 33 over the gate structure 26 and the sidewall spacer 36 adjacent to the gate structure 26. Another portion of the self-aligned contact cap 33 over the gate structure 26 and the sidewall spacer 38 are masked during etching by the masking layer 50 and hardmask layer 52. The opening 54 is aligned over a portion of the gate structure 22 for formation of a gate contact, and the opening 56 is aligned over a portion of the gate structure 26 and epitaxial semiconductor layer 44 for formation of a cross-coupling contact, as described below.

Figure 4:
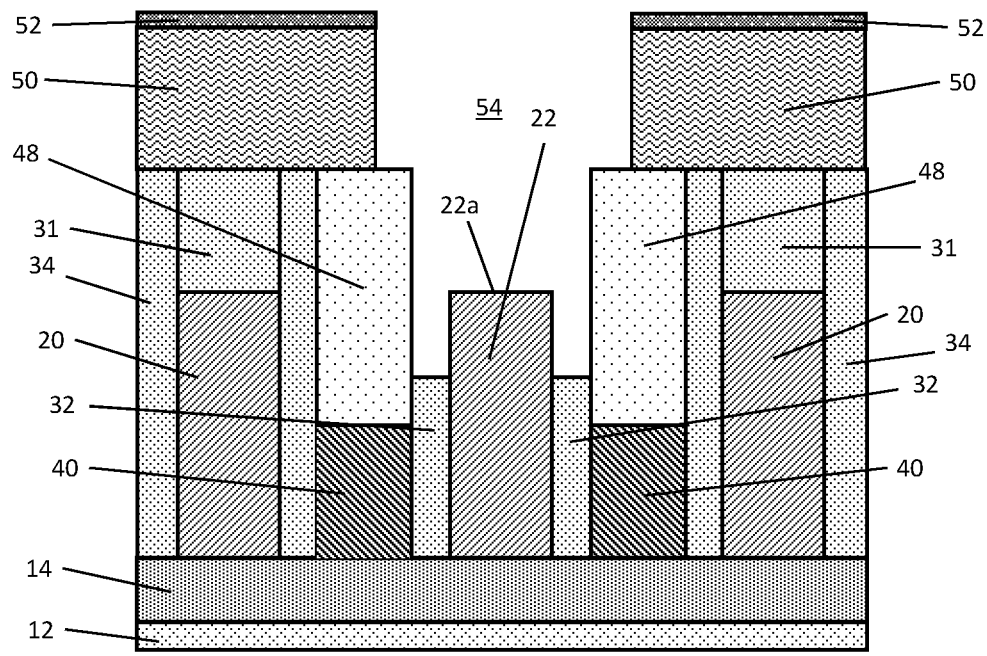
Figure 4A:
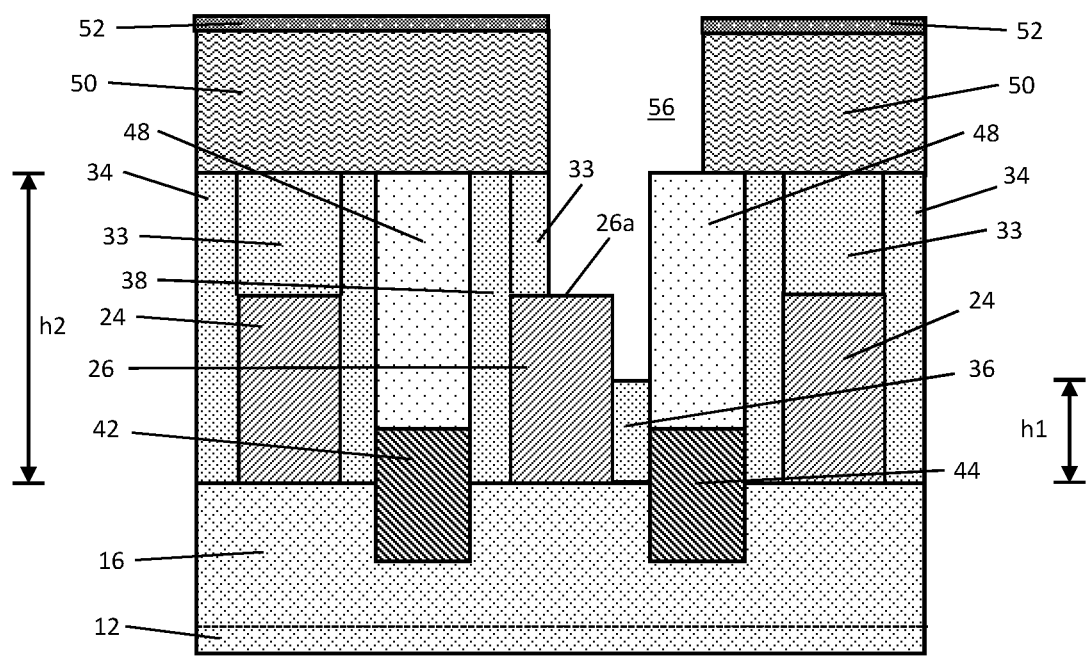

With reference to FIGS. 4 and 4A in which like reference numerals refer to like features in FIGS. 3 and 3A and at a subsequent fabrication stage of the processing method, the self-aligned contact cap 31 over the gate structure 22 and the exposed portion of self-aligned contact cap 33 over the gate structure 26 are etched with an etching process. The removal of self-aligned contact cap 31 exposes an upper portion of gate structure 22 and the removal of self-aligned contact cap 33 exposes an upper portion of the gate structure 26. A portion of the gate structure 26 remains covered by the partially-removed self-aligned contact cap 33. The etching process also recesses the sidewall spacers 32 relative to the top surface 22a of the gate structure 22 and the sidewall spacer 36 relative to the top surface 26a of the gate structure 26 because an over-etch is used during the etching process to ensure that the top surfaces of the gate structures 22, 26 are cleared of dielectric material and exposed.

The etching process may include, for example, a reactive ion etch (ME) that removes the material of the self-aligned contact caps 31, 33 and the spacers 32, 36 selective to the materials of the gate structures 22, 26 and the interlayer dielectric layer 48. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The recessing of the sidewall spacers 32, 36 produces "divots" or gaps over the sidewall spacers 32 between the gate structure 22 and the interlayer dielectric layer 48, and also over the sidewall spacer 36 between the gate structure 26 and the interlayer dielectric layer 48. The amount of over-etch may be controlled during the etching process so that the top surface of the recessed sidewall spacers 32 is arranged above top surface of the epitaxial semiconductor layers 40 and the top surface of the recessed sidewall spacer 36 is arranged above top surface of the epitaxial semiconductor layer 44. The height of the recessed sidewall spacer 36 is less than its original height and is equal to a height, h1. The sidewall spacer 38, which is masked by masking layer 50 during the etching process, is not recessed and retains its original height, h2. The height, h2, of the sidewall spacer 38 is greater than the height, h1, of the recessed sidewall spacer 36. The sidewall spacers 32 may have the same height following the etching process.

In conventional fabrication processes forming cross-coupling contacts, the self-aligned contact cap is not etched until after portions of the interlayer dielectric layer have been removed to allow for trench silicide formation to form the contact. The consequence is that the epitaxial semiconductor providing the source/drain region for the cross-coupling contact is exposed and can be damaged during the etching of the self-aligned contact cap over the neighboring gate structure that is to participate in the formation of the cross-coupling contact.

In the embodiments of the processing method described herein, the epitaxial semiconductor layer 44, as well as the epitaxial semiconductor layers 40, are masked and protected by the interlayer dielectric layer 48, in addition to the sidewall spacers 32, 36, during the etching of the self-aligned contact caps 31, 33. The interlayer dielectric layer 48 is removed in a subsequent fabrication stage of the process flow, as described further below, and only after the self-aligned contact caps 31, 33 have been etched.

Figure 5:
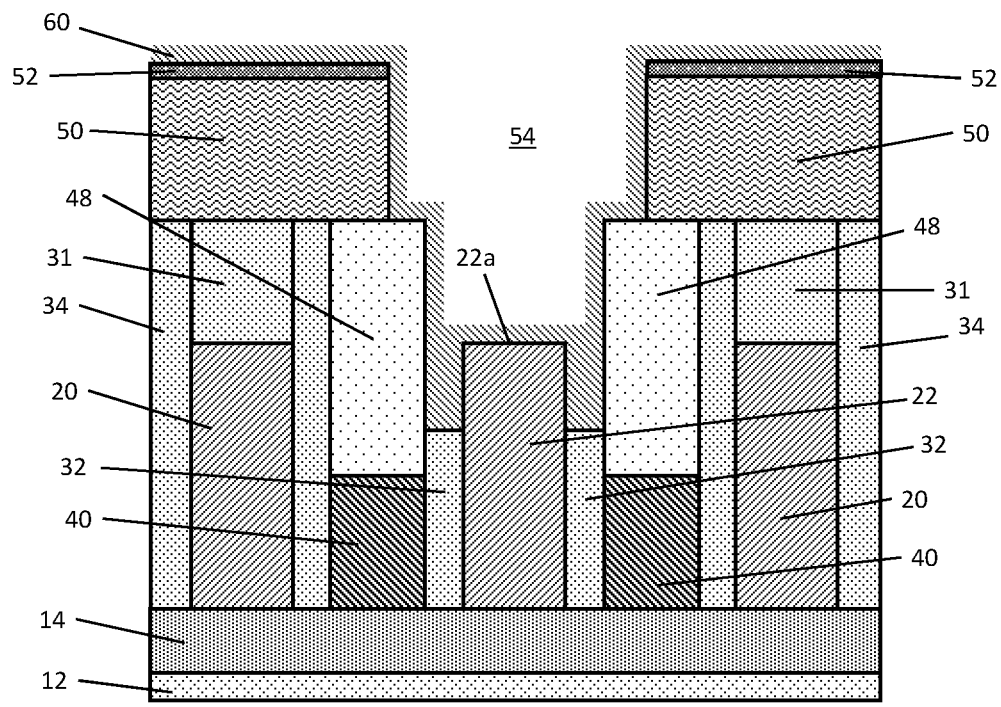
Figure 5A:
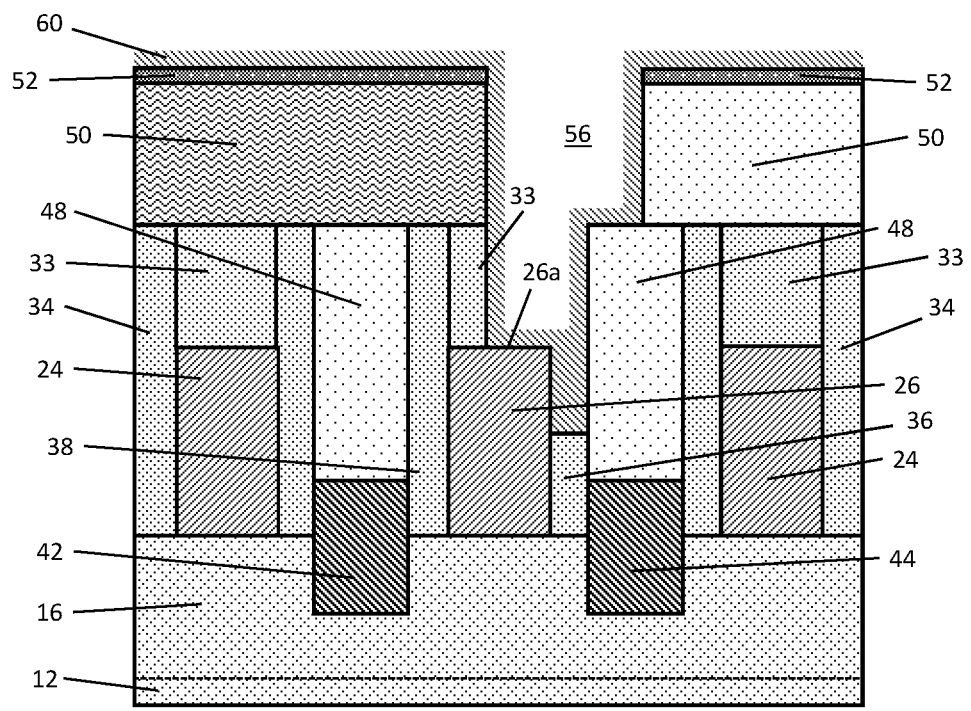

With reference to FIGS. 5 and 5A in which like reference numerals refer to like features in FIGS. 4 and 4A and at a subsequent fabrication stage of the processing method, a dielectric layer 60 is formed that follows the contour of the exposed portions of the gate structures 22, 26. The dielectric layer 60 may be a conformal layer deposited by, for example, atomic layer deposition (ALD) that fills in the divots or gaps over the sidewall spacers 32 and sidewall spacer 36 produced when the sidewall spacers 32 and sidewall spacer 36 are recessed. The dielectric layer 60 may be composed of, for example, an oxide of silicon (e.g., silicon dioxide), silicon nitride, silicon carbide, or silicon oxycarbide. The dielectric material of the dielectric layer 60 has a different composition than the dielectric materials of the interlayer dielectric layer 48 and the sidewall spacers 32, 36, which provides etch selectivity.

Figure 6:
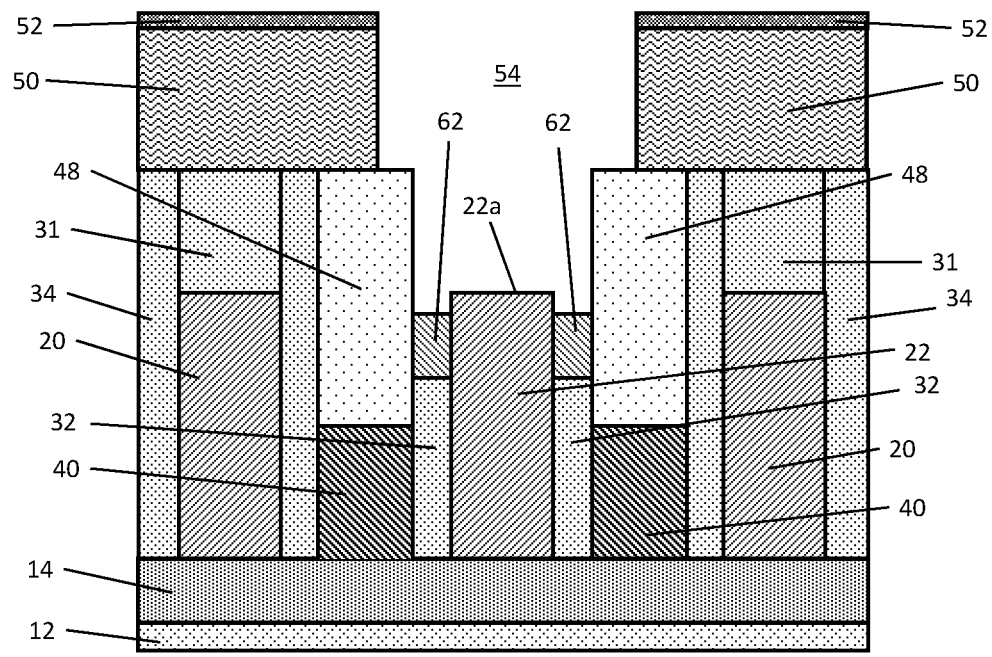
Figure 6A:
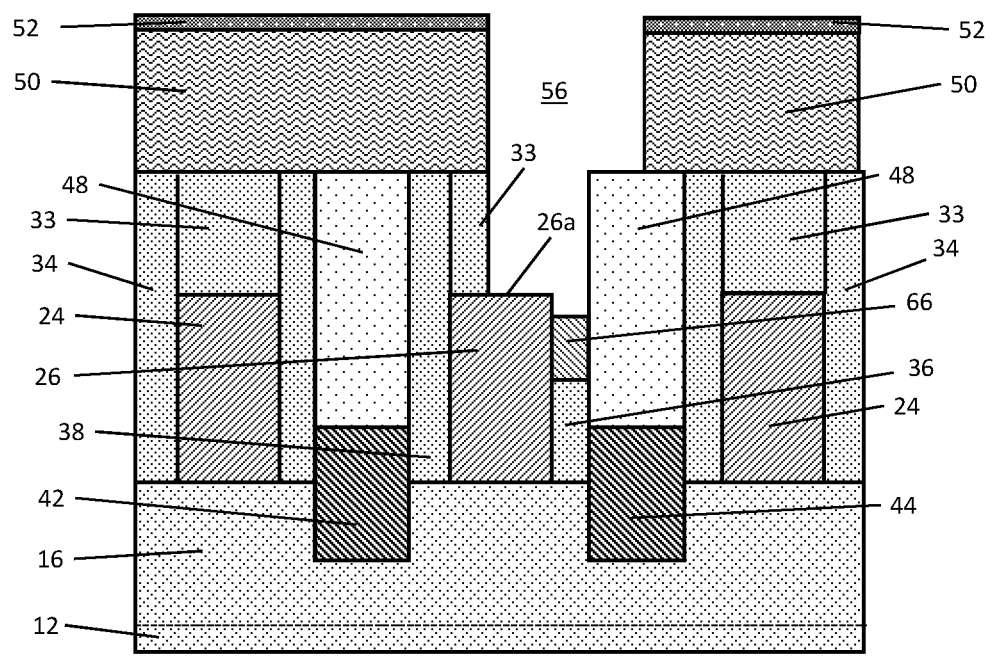

With reference to FIGS. 6 and 6A in which like reference numerals refer to like features in FIGS. 5 and 5A and at a subsequent fabrication stage of the processing method, the dielectric layer 60 is etched back with an isotropic etching process to form sidewall spacers 62 and a sidewall spacer 66. The sidewall spacers 62 are respectively arranged over the sidewall spacers 32 associated with the gate structure 22 and project above the top surface 22a of the gate structure 22, and the sidewall spacer 66 is arranged over the sidewall spacer 36 associated with the gate structure 26 and project above the top surface 26a of the gate structure 26. The stacked arrangement including the sidewall spacers 32 and the sidewall spacers 62 form composite spacers that include dielectric materials of different compositions and with etch selectivity to each other. The addition of the sidewall spacers 62 and the sidewall spacer 66 compensates for the recessing of the sidewall spacers 32 and the sidewall spacer 36 generated from the over-etch during the etching of the self-aligned contact caps 31, 33.

Figure 7:
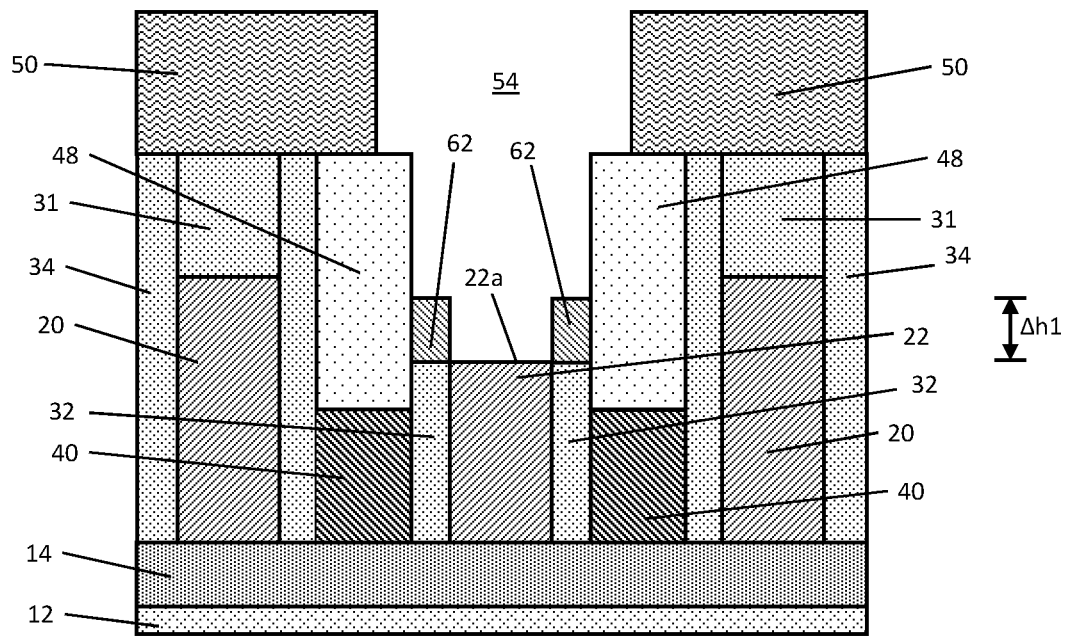
Figure 7A:
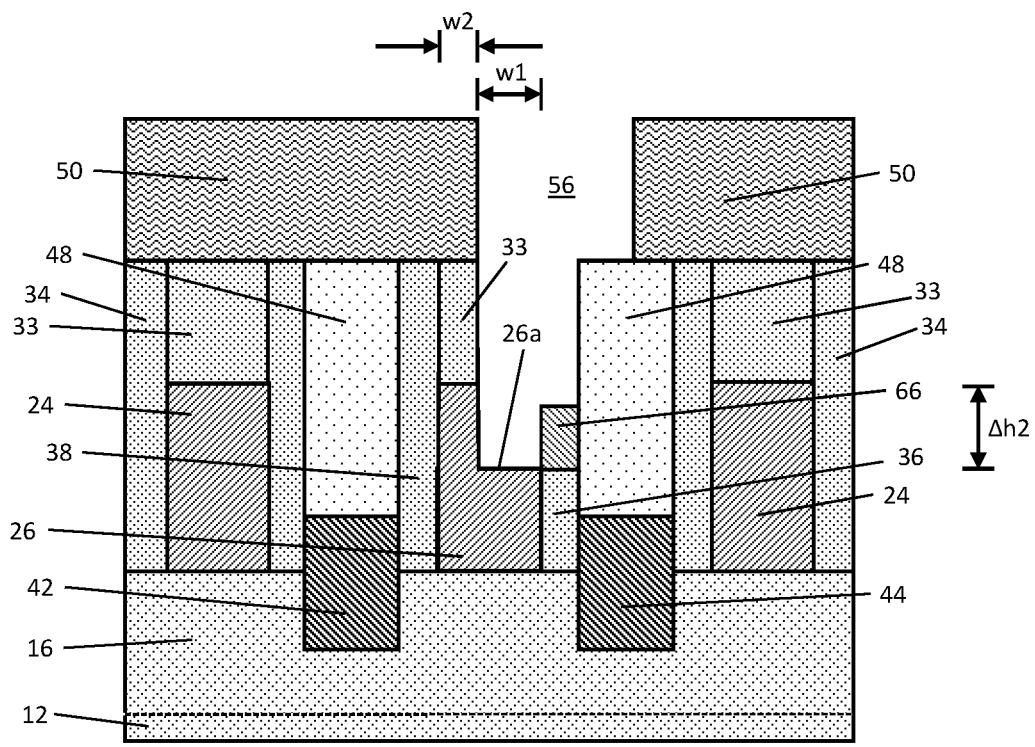

With reference to FIGS. 7 and 7A in which like reference numerals refer to like features in FIGS. 6 and 6A and at a subsequent fabrication stage of the processing method, the metal gate material and high-k dielectric material of the gate structure 26 are etched and a section is recessed by a distance $\Delta h2$ so that the distance separating the top surface 26a of the recessed section of the gate structure 26 from the top surfaces of the neighboring self-aligned contact caps 33 and interlayer dielectric layer 48 is increased. The etched gate structure 26, which is partially masked by the overlying self-aligned contact cap 33, includes a section of width w1 in which the top surface 26a is recessed and a section of width w2 in which the top surface 26a is not recessed, which provides the gate structure 26 with a notched shape. The top surface 26a of the recessed section of the gate structure 26 is located below the top surface of the upper sidewall spacer 66 and a section of the self-aligned contact cap 33 remains over the non-recessed section of the gate structure 26 and the adjacent sidewall spacer 38.

The metal gate material and high-k dielectric material of the gate structure 22, which is exposed through opening 54, are also recessed by a distance $\Delta h1$. The upper sidewall spacers 62 extend above the top surface 22a of the recessed gate structure 22.

The gate structure 22 and the gate structure 26 may be recessed by one or more selective etching processes that remove the metal gate material and high-k dielectric material of the gate structures 22, 26 selective to the materials of the upper sidewall spacers 62, the sidewall spacer 66, and the interlayer dielectric layer 48. The sidewall spacers 62, 66 mask and protect the underlying lower sidewall spacers 32, 36 during the etching process recessing the gate structures 22, 26. Because the gate structure 26 is partially exposed by the opening 56 and partially masked by the masking layer 50, the etch process results in gate structure 26 having a notched profile in which a portion of the gate structure 26 farthest from the epitaxial semiconductor layer 44 retains the original $\Delta$ and is not recessed. The hardmask layer 52 may also be removed from over masking layer 50.

In conventional fabrication processes, gate structures that are intended to connect with adjacent source/drain regions, via a cross-coupling contact, are not recessed. In conventional fabrication processes, the conductor deposited to form the cross-coupling contact is planarized by chemical mechanical polishing, which may reduce the thickness of the cross-coupling contact and, in particular, may reduce the thickness of the portion of the cross-coupling contact extending over and across the sidewall spacer between the source/drain region and the gate structure. By recessing a portion of the gate structure 26 as described above, the available space in a vertical direction over the top surface 26a of the gate structure 26 is increased, which in turn increases the process tolerance to thickness losses during planarization of the conductor deposited to form the cross-coupling contact.

Figure 8:
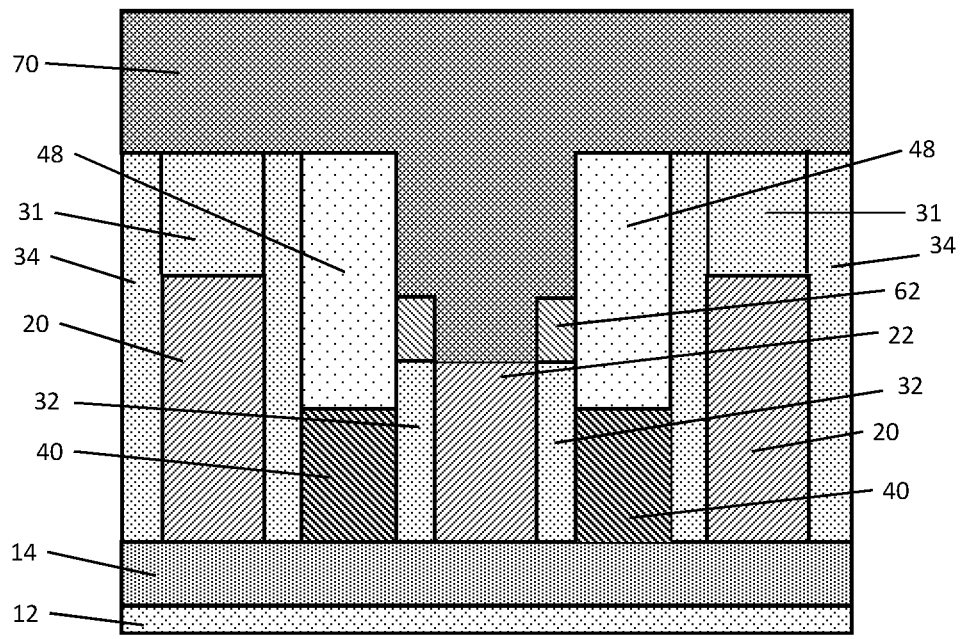
Figure 8A:
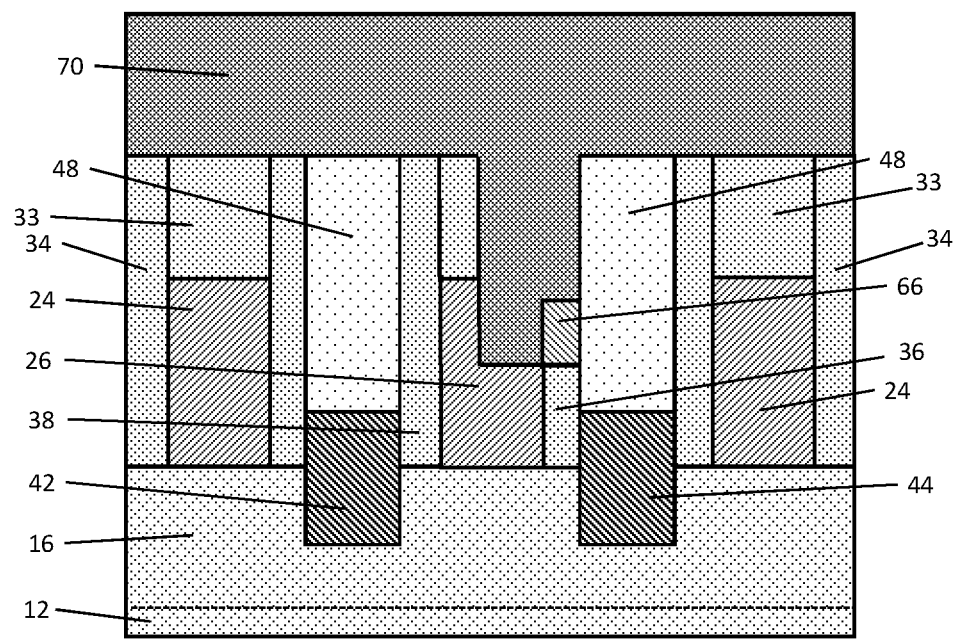

With reference to FIGS. 8 and 8A in which like reference numerals refer to like features in FIGS. 7 and 7A and at a subsequent fabrication stage of the processing method, masking layer 50 is removed by, for example, ashing. Another masking layer 70 is formed over gate structures 20, 22, 24, 26 and the interlayer dielectric layer 48, the upper sidewall spacers 62, 66, and the gate structures 22, 26. The masking layer 70 may be composed of an organic planarization layer (OPL) material.

Figure 9:
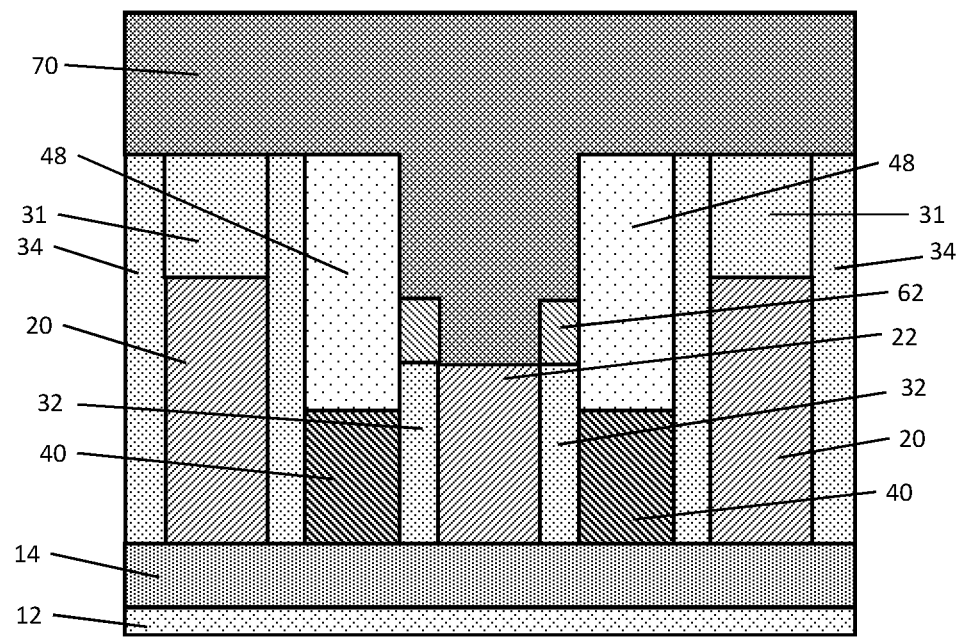
Figure 9A:
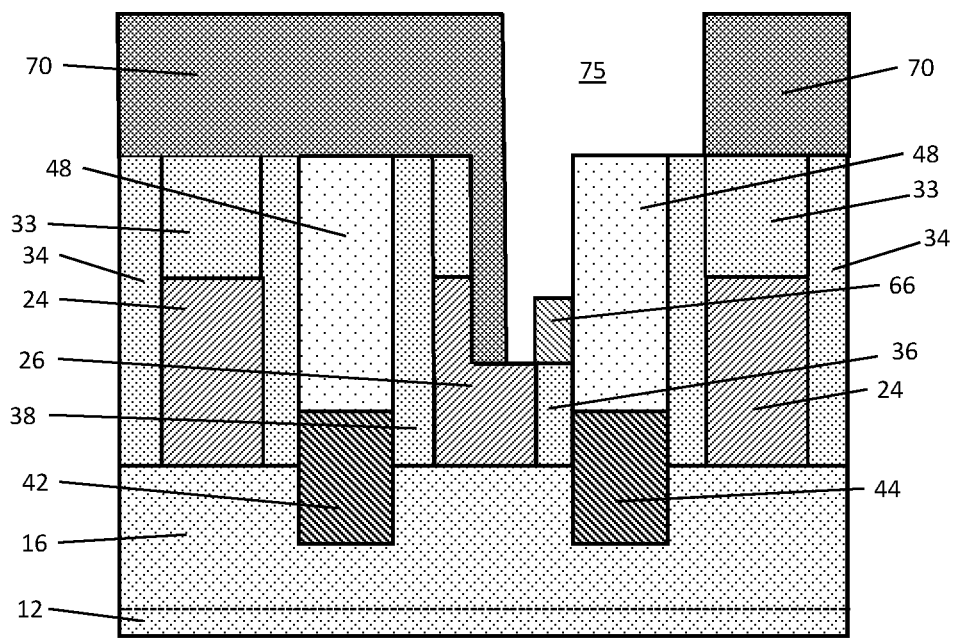

With reference to FIGS. 9 and 9A in which like reference numerals refer to like features in FIGS. 8 and 8A and at a subsequent fabrication stage of the processing method, the masking layer 70 is patterned with lithography and etching to form an opening 75. The opening 75 in the masking layer 70 exposes the section of the interlayer dielectric layer 48 over the epitaxial semiconductor layer 44 and the sidewall spacer 66, and may expose the gate structure 26. The upper sidewall spacers 62 are covered by the masking layer 70.

Figure 10:
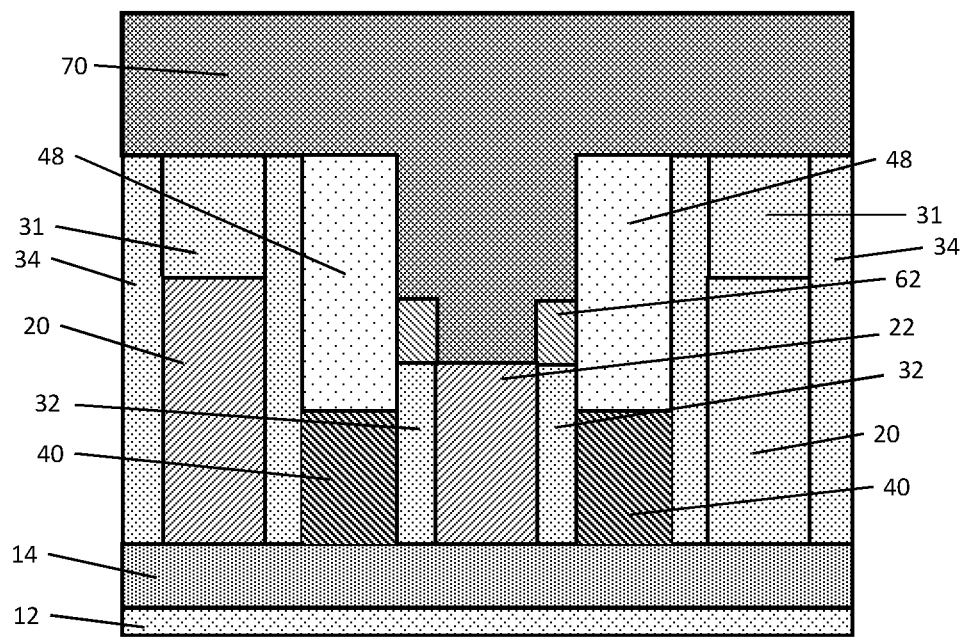
Figure 10A:
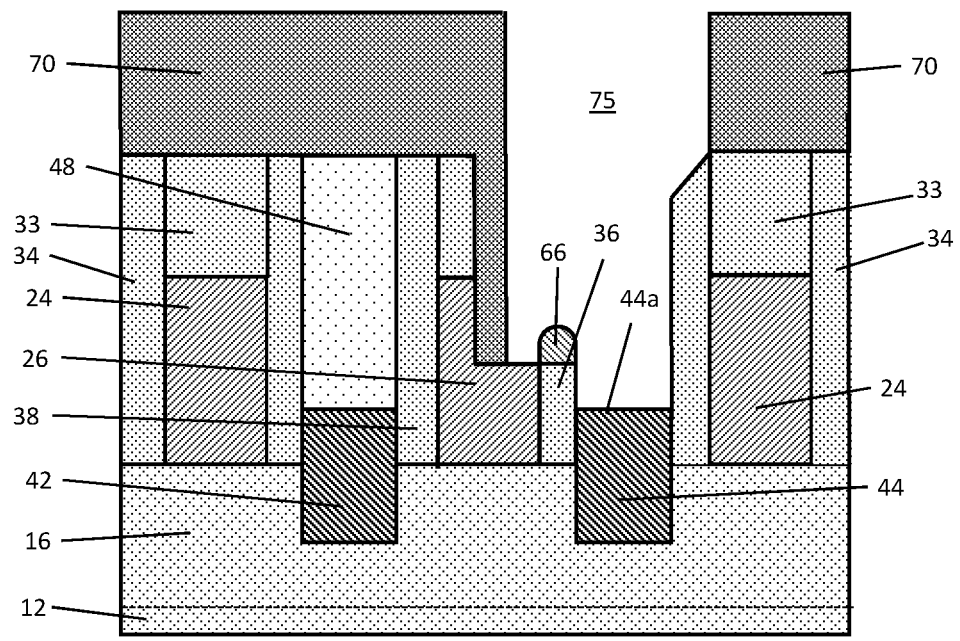

With reference to FIGS. 10 and 10A in which like reference numerals refer to like features in FIGS. 9 and 9A and at a subsequent fabrication stage of the processing method, the exposed interlayer dielectric layer 48 is removed from its location over the epitaxial semiconductor layer 44, which exposes the top surface 44a of the epitaxial semiconductor layer 44. The interlayer dielectric layer 48 may be removed, for example, by a reactive ion etching process to remove the material of the interlayer dielectric layer 48 selective to the materials of the sidewall spacer 66 and self-aligned contact cap 33. The selective etch process may etch an unmasked portion of self-aligned contact cap 33 exposed through the opening 75 in the masking layer 70. The etch process may also partially etch and, preferably not remove, the material of sidewall spacer 66. The upper sidewall spacer 66, which is sacrificial, protects the underlying lower sidewall spacer 36 from the etching process.

Figure 11:
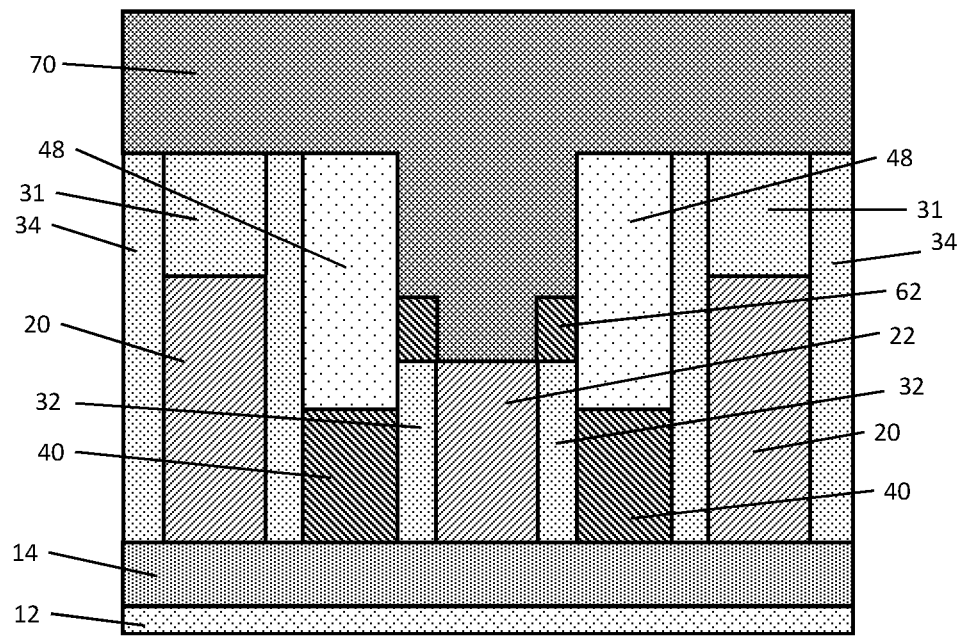
Figure 11A:
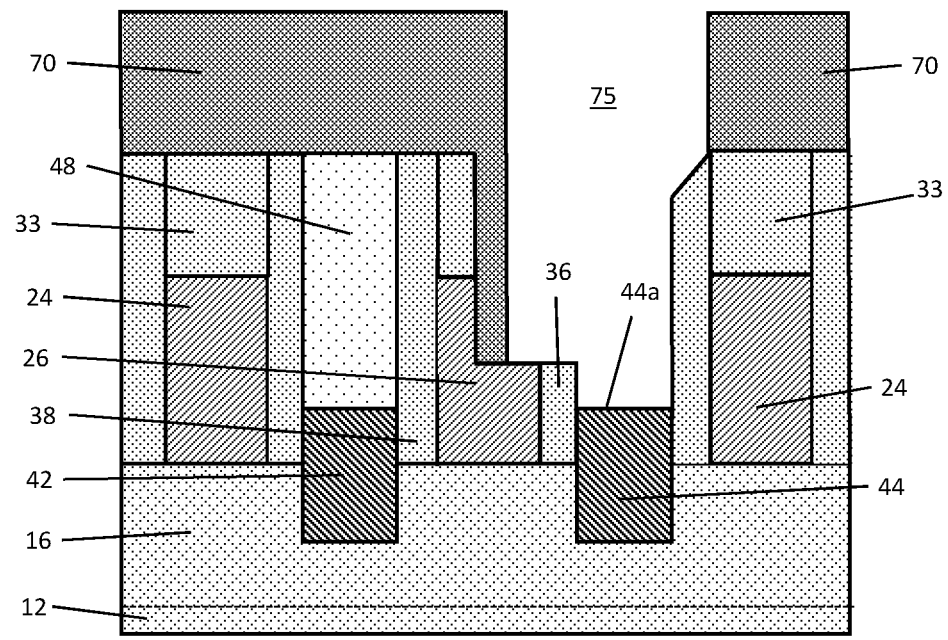

With reference to FIGS. 11 and 11A in which like reference numerals refer to like features in FIGS. 10 and 10A and at a subsequent fabrication stage of the processing method, the remnant of the sidewall spacer 66 is removed from over sidewall spacer 36 by, for example, a reactive ion etching process. The upper sidewall spacers 62 are masked and protected by the masking layer 70 during the etching process. The result is that the upper sidewalls spacers 62, which are formed in part in the divots adjacent to the gate structure 22, are retained, and the upper sidewall spacer 66, which is formed in part in the divots adjacent to the gate structure 26, is absent in the completed device structure.

Figure 12:
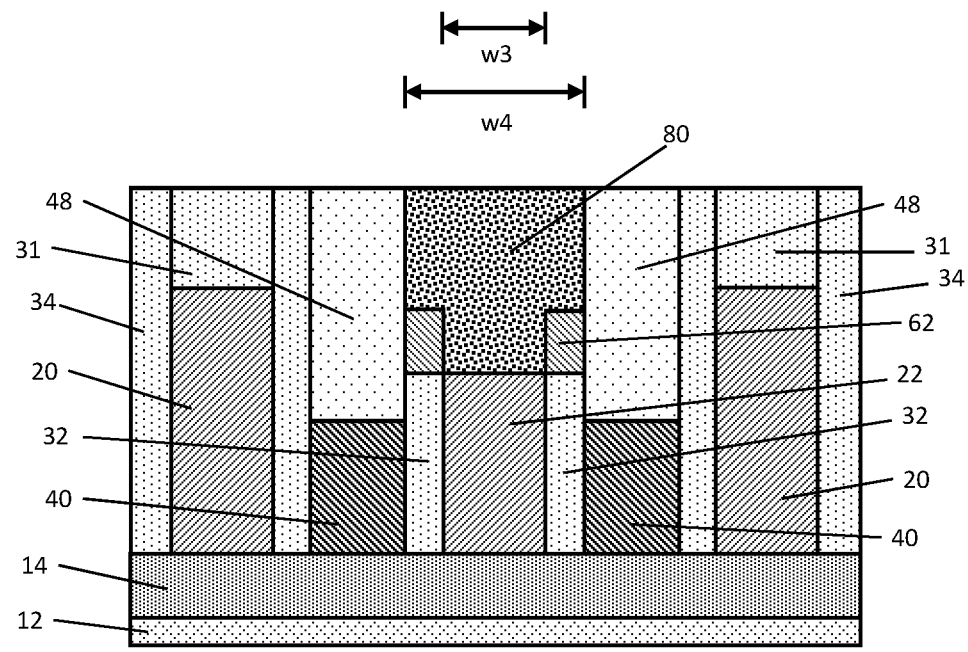
Figure 12A:
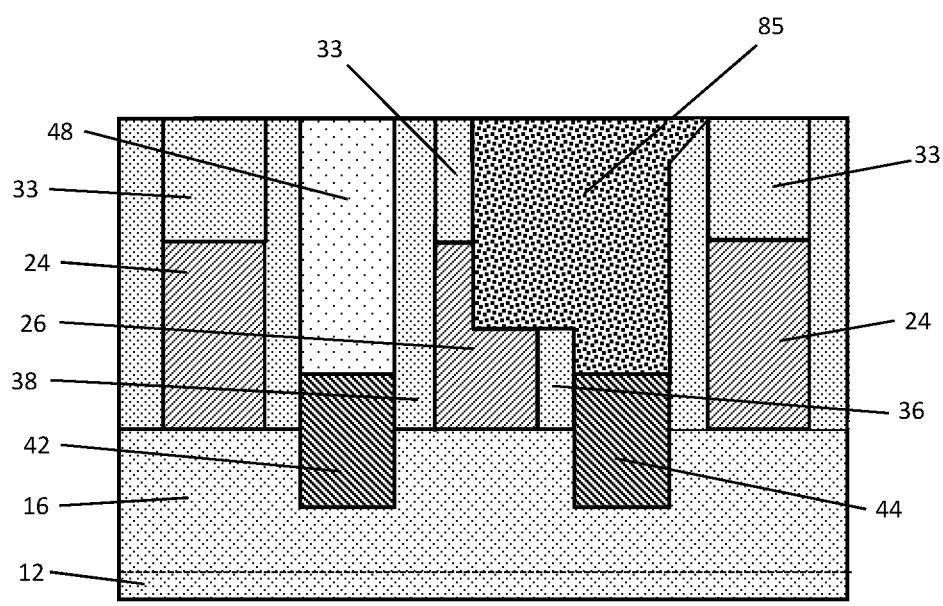

With reference to FIGS. 12 and 12A in which like reference numerals refer to like features in FIGS. 11 and 11A and at a subsequent fabrication stage of the processing method, the masking layer 70 is removed by, for example, an ashing process, followed by the concurrent formation of a gate contact 80 over gate structure 22 and a cross-coupling contact 85 over gate structure 26 and epitaxial semiconductor layer 44. The gate contact 80 and the cross-coupling contact 85 may be formed of a metal silicide deposited by chemical vapor deposition (CVD) or atomic layer deposition (ALD) and planarized by a chemical-mechanical planarization (CMP) process.

The gate contact 80 is arranged in direct contact with the top surface 22a of the gate structure 22. In the completed structure, the upper sidewall spacers 62 provide additional dielectric material that is arranged between the adjacent epitaxial semiconductor layers 40 and the gate contact 80, thereby compensating for the material of sidewall spacers 32 that is recessed when removing the self-aligned contact cap 31 from over the gate structure 22 and the self-aligned contact cap 33 from over the gate structure 26. Due to the presence of the sidewall spacers 62, the resulting gate contact 80 has a dual-width or T-shaped cross-sectional profile with a narrower section of width w3 arranged in the vertical direction between the sidewall spacers 32 directly above a top surface of the gate structure 22 and a wider section of width w4 arranged in the vertical direction over the narrower section and over the sidewall spacers 32. The sidewall spacers 32 provide an additional thickness of dielectric material that may reduce the incidence of shorting between the gate contact 80 and the epitaxial semiconductor layers 40.

The cross-coupling contact 85 is in direct contact with the top surface 26a of the metal gate material of the gate structure 26 and with the top surface 44a of the epitaxial semiconductor layer 44. The cross-coupling contact 85 connects the gate structure 26 and epitaxial semiconductor layer 44 so that the gate structure 26 is conductively coupled with the epitaxial semiconductor layer 44. Following planarization, the cross-coupling contact 85 has a thickness that is increased by the recessing of the gate structure 26 and the recessing of the sidewall spacer 36. In particular, the thickness of the cross-coupling contact 85 is greater than the thickness of the removed self-aligned contact cap 33 and the remaining self-aligned contact cap 33 over the adjacent gate structure 24.

In conventional process flows in which gate structures are not recessed prior to contact formation, the cross-coupling contacts have a thickness less than or equal to the thickness of the removed self-aligned gate cap. Planarization of the deposited conductor may reduce the thickness of the cross-coupling contact so that a thin piece of conductor provides a weak cross-link, and may even polish through the complete thickness of cross-coupling contact. By recessing the gate structure 26 before forming the cross-coupling contact 85, the thickness of the cross-coupling contact 85 will increase the degree of physical contact and conductive contact between the gate structure 26 and the cross-coupling contact 85, and may anticipate and compensate for the thinning of the cross-coupling contact 85 that may be produced during planarization.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first gate structure;
    forming a first sidewall spacer at a first sidewall of the first gate structure;
    forming a first epitaxial semiconductor layer adjacent to the first sidewall spacer;
    after forming the first epitaxial semiconductor layer, recessing the first sidewall spacer relative to a top surface of the first gate structure with a first etching process;
    after recessing the first sidewall spacer, removing a first portion of the first gate structure with a second etching process; and
    after removing the first portion of the first gate structure, forming a cross-coupling contact that extends over the first sidewall spacer to couple a second remaining portion of the first gate structure with the first epitaxial semiconductor layer.

2. The method of claim 1 further comprising:
    after the first sidewall spacer is recessed, forming a second sidewall spacer over the first sidewall spacer.

3. The method of claim 2 further comprising:
before recessing the first sidewall spacer, forming a section of an interlayer dielectric layer over the first epitaxial semiconductor layer; and
after recessing the first gate structure, removing the section of the interlayer dielectric layer,
wherein the second sidewall spacer is at least partially removed when removing the section of the interlayer dielectric layer.

4. The method of claim 2 wherein the first sidewall spacer is formed from a first dielectric material, and the second sidewall spacer is formed from a second dielectric material that is removable selective to the first dielectric material of the first sidewall spacer.

5. The method of claim 1 further comprising:
forming a second gate structure and a second sidewall spacer at a second sidewall of the second gate structure;
forming a second epitaxial semiconductor layer adjacent to the second sidewall spacer;
after forming the second epitaxial semiconductor layer, recessing the second sidewall spacer relative to the second gate structure;
after recessing the second sidewall spacer, recessing the second gate structure; and
after recessing the second gate structure, forming a gate contact coupled with the second gate structure.

6. The method of claim 5 further comprising:
after the second sidewall spacer is recessed, forming a third sidewall spacer over the first sidewall spacer.

7. The method of claim 6 wherein the gate contact includes a first section in contact with a top surface of the second gate structure and a second section over the first section and the third sidewall spacer, and the second section is wider than the first section.

8. The method of claim 5 wherein the second gate structure is recessed when the first portion of the first gate structure is removed.

9. The method of claim 5 wherein the second sidewall spacer is recessed when the first sidewall spacer is recessed.

10. The method of claim 1 wherein a self-aligned contact cap is arranged over the first gate structure before the first etching process, and the first etching process removes a portion of the self-aligned contact cap to expose the first portion of the first gate structure that is removed by the second etching process.

11. The method of claim 10 further comprising:
before recessing the first sidewall spacer, forming a section of an interlayer dielectric layer over the first epitaxial semiconductor layer; and
after removing the first portion of the first gate structure, removing the section of the interlayer dielectric layer,
wherein the section of the interlayer dielectric layer is removed after removing the portion of the self-aligned contact cap.

* * * * *